United States Patent
Naik et al.

(10) Patent No.: US 12,234,554 B2
(45) Date of Patent: Feb. 25, 2025

(54) SEMICONDUCTOR DEPOSITION REACTOR AND COMPONENTS FOR REDUCED QUARTZ DEVITRIFICATION

(71) Applicant: ASM IP HOLDING B.V., Almere (NL)

(72) Inventors: Rutvij Naik, Tempe, AZ (US); Junwei Su, Tempe, AZ (US); Wentao Wang, Chandler, AZ (US); Chuqin Zhou, Tempe, AZ (US); Xing Lin, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 373 days.

(21) Appl. No.: 17/810,094

(22) Filed: Jun. 30, 2022

(65) Prior Publication Data

US 2023/0002895 A1 Jan. 5, 2023

Related U.S. Application Data

(60) Provisional application No. 63/217,122, filed on Jun. 30, 2021.

(51) Int. Cl.
*C23C 16/458* (2006.01)
*C23C 16/455* (2006.01)

(52) U.S. Cl.
CPC ........ *C23C 16/4585* (2013.01); *C23C 16/455* (2013.01)

(58) Field of Classification Search
CPC ............ C23C 16/455; C23C 16/45504; C23C 16/4404; C23C 16/45521; C23C 16/482; C23C 16/4585; H01L 21/68785; H01L 21/6719

See application file for complete search history.

(56) References Cited

U.S. PATENT DOCUMENTS

| | | | |
|---|---|---|---|
| 6,464,792 B1 * | 10/2002 | Wengert | C23C 16/45502 118/724 |
| 6,554,905 B1 | 4/2003 | Goodwin | |
| 6,634,882 B2 | 10/2003 | Goodman | |
| 6,709,267 B1 | 3/2004 | Hawkins et al. | |
| 7,033,445 B2 | 4/2006 | Keeton et al. | |
| 7,231,141 B2 | 6/2007 | Jacobson et al. | |
| D600,223 S | 9/2009 | Aggarwal et al. | |
| 7,648,579 B2 | 1/2010 | Goodman et al. | |
| 8,088,225 B2 | 1/2012 | Goodman et al. | |

(Continued)

FOREIGN PATENT DOCUMENTS

TW D210557 3/2021

*Primary Examiner* — Joseph A Miller, Jr.
(74) *Attorney, Agent, or Firm* — Banner & Witcoff, Ltd.

(57) ABSTRACT

Systems of reducing devitrification within a chemical vapor deposition system can include a susceptor support ring that is configured to be positioned between a gas inlet and a gas outlet of a chamber passage. An example system can also include a getter support comprising a support base and one or more recesses therein. Each of the one or more recesses can be arranged to receive corresponding one or more support elements that are configured to support the getter plate. At least a portion of the getter support may include a coating comprising silicon carbide (SiC) having a thickness of at least about 50 microns. The getter support may be arranged to be disposed a maximum distance of between about 1 mm and about 10 mm from the susceptor support ring.

20 Claims, 12 Drawing Sheets

(56) References Cited

U.S. PATENT DOCUMENTS

| | | |
|---|---|---|
| 8,394,229 B2 | 3/2013 | Aggarwal et al. |
| 8,801,857 B2 | 8/2014 | Aggarwal et al. |
| D743,357 S | 11/2015 | Vyne |
| D793,352 S | 8/2017 | Hill |
| 2001/0047750 A1* | 12/2001 | Ishida ................ C23C 16/4404 117/200 |
| 2022/0130668 A1 | 4/2022 | Tolle et al. |

* cited by examiner

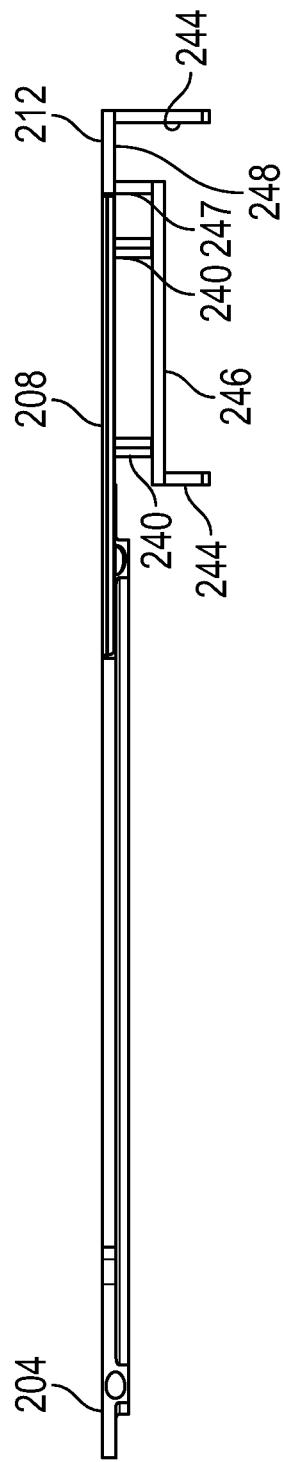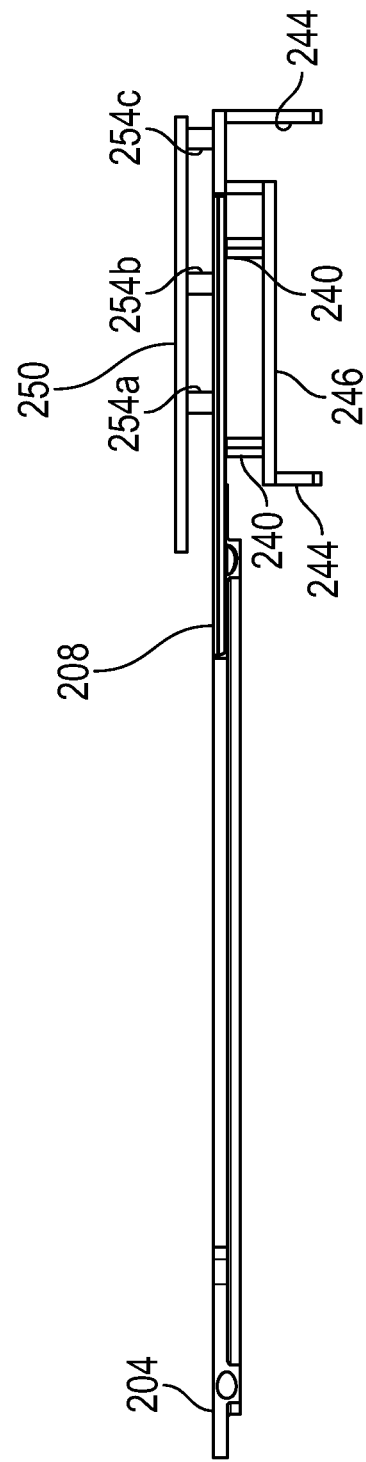

SEMICONDUCTOR DEPOSITION REACTOR AND COMPONENTS FOR REDUCED QUARTZ DEVITRIFICATION

CROSS REFERENCE TO RELATED APPLICATION

This application claims the priority benefit of U.S. Provisional Application No. 63/217,122, filed Jun. 30, 2021, the entirety of which is hereby incorporated by reference herein.

BACKGROUND

Field of the Invention

This disclosure relates generally to semiconductor processing, and more particularly to susceptor supports, getter support elements, and other system elements for processing semiconductor substrates in processing chambers.

Description of the Related Art

Semiconductor substrates, such as semiconductor wafers, are typically processed within a processing chamber under controlled process conditions, including exposure to elevated temperatures. A susceptor support, which is commonly referred to as a ring (e.g., a one-piece ring (OPR)) is usually used to support the susceptor during processing (e.g., during a deposition) in the processing chamber. A getter element may be included within the processing chamber. The getter element may be supported at least in part by a getter support element or plate. A number of quality control issues related to the interaction between the substrate may arise during processing, such as devitrification of one or more of the processing components, and there is a continuing need to address these quality control issues.

SUMMARY

Various examples of semiconductor deposition components and related processing systems and methods are disclosed.

In some embodiments, a chemical vapor deposition system is disclosed. The system can include chamber boundaries defining a deposition chamber, a susceptor, a susceptor support ring, a getter plate, and a getter support. The chamber boundaries can include a deposition gas inlet at an upstream end and a gas outlet at a downstream end, the chamber boundaries can define a generally horizontal chamber passage that is configured to conduct gas flow along a gas flow direction therethrough. The susceptor can be configured to support a substrate thereon. The chamber boundaries above the susceptor can be generally transparent to radiation energy. The susceptor support ring can be positioned in the chamber passage between the gas inlet and the gas outlet. The getter plate can be positioned generally horizontally within the chamber. The getter plate can extend generally parallel to the susceptor and extend laterally substantially across the deposition chamber. The getter support can include a support base and one or more support elements. At least a portion of the getter support can include a coating comprising silicon carbide (SiC). The getter support can be disposed a maximum distance from the susceptor support ring.

In some embodiments, the susceptor support ring can be positioned in the chamber passage between the gas inlet and the gas outlet and include an aperture having a center that is disposed nearer to an upstream edge of the susceptor support ring than to a downstream edge. The susceptor support ring can include first one or more recesses configured to support a support element thereon. The getter support can extend generally parallel to the susceptor and have an upstream edge shape that generally conforms to a corresponding downstream edge shape of the susceptor support ring. The getter support can be disposed within a maximum distance from the susceptor support ring, the getter support comprising one or more recesses configured to receive corresponding one or more support elements configured to at least partially support a getter element.

BRIEF DESCRIPTION

FIG. 13 shows a right view of the assembly of FIG. 9.

FIG. 14 shows a right view of the assembly of FIG. 9 with an example getter plate.

DETAILED DESCRIPTION

Figure 1:
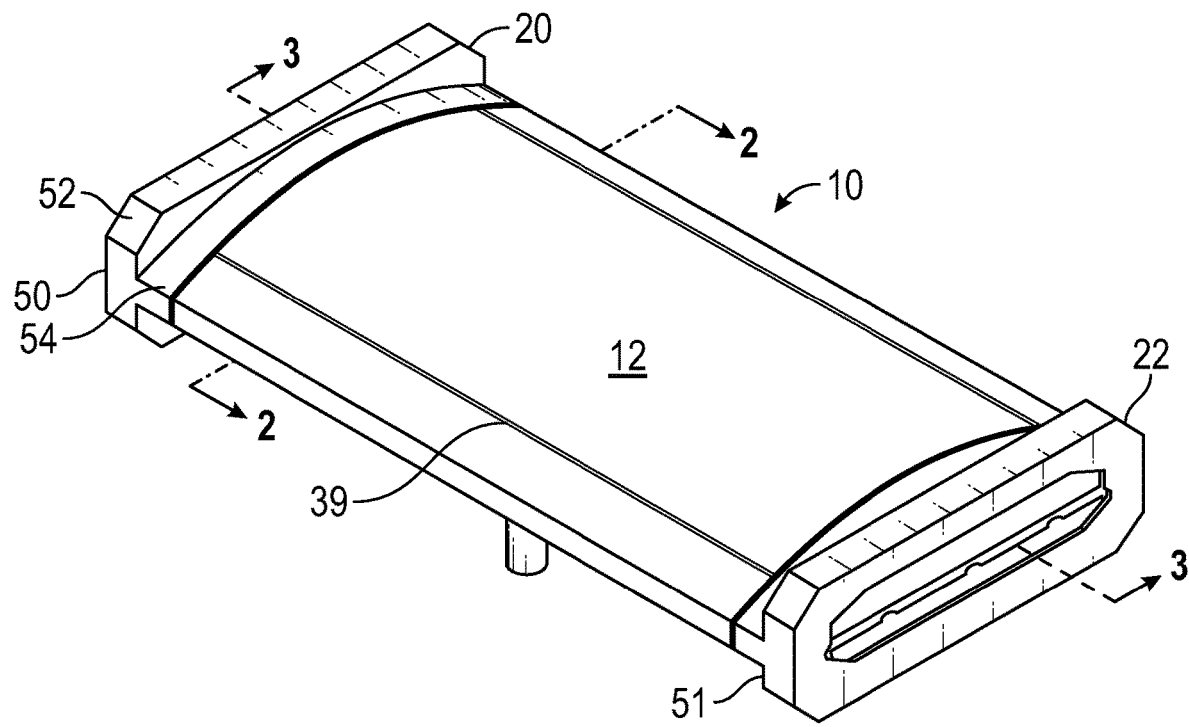
FIG. 1 is a perspective view of an example embodiment of a process chamber.

Process chambers for thermally processing semiconductor wafers are frequently made of quartz (vitreous silica) or similar material because quartz is substantially transparent to radiant energy. Thus, radiant heaters may be positioned adjacent or near the exterior of the chamber (e.g., top of the chamber, bottom of the chamber), and a wafer being processed in the chamber can be heated to elevated temperatures without having the chamber walls heated to the same level. On the other hand, quartz is desirable because it can withstand very high temperatures. Quartz is also desirable because of its inert characteristics that enable it to generally withstand degradation by various processing gases and because of its high purity characteristics.

Due to the high temperatures associated with thermally activated chemical vapor deposition processes, the walls and other components of and/or in the process chamber often heat up to a certain degree, and chemical particulates are deposited thereon. These particulates may arise from chemicals in the gases that pass through the reaction chamber and can cause serious problems with the purity of the resulting processed wafer. For example, such impurities can cause devitrification (e.g., wrinkles within a surface of the crystal instead of smooth or glossy surface) or other deterioration of quartz surfaces. As a result, there has been a large effort to reduce the buildup of particulate matter on reaction chamber walls. One solution is to periodically etch the insides of the process chambers to remove the particulate matter before it accumulates to a harmful level. Unfortunately, quartz process chambers take a long time to heat up due to their high transparency to radiant heat. These periodic slow etch cycles thus reduce the maximum throughput of the machine. Moreover, etching may not address the underlying deterioration of the quartz from the devitrification. When running certain processes (e.g., thick layering processes), devitrification of the quartz increases and causes flakes and particles that exacerbate the impurities in the processing chamber.

The temperature gradient across the substrate or other element in the reaction chamber may be generally nonuniform from a leading edge to a trailing edge (defined by the gas flow direction), which may make certain portions of the reactor elements more susceptible to devitrification. The temperature of the gas can further be influenced by its proximity to the heat-absorbing susceptor (substrate support) underneath the wafer. As the gas approaches and passes over the susceptor, it heats up fairly quickly to a maximum temperature towards the downstream edge of the susceptor, and then drops off after traveling past that point. Thus, devitrification tends to accumulate on the quartz surfaces nearest the susceptor, particularly near a downstream edge of the susceptor due to the direction of the flow of gas.

The reaction chamber may include a getter plate or other getter element used to improve reaction efficiency. The getter can be supported at least in part by a getter support. The getter support may generally comprise, consist essentially of or consist of quartz. Due to the proximity of the getter support to the susceptor, the getter support may experience devitrification. A getter support is a component positioned towards the exhaust portion of the reaction chamber. The getter support holds the getter plate intact. The getter plate can absorb the thermal radiation that reduces (e.g., prevents) the chamber coating.

Accordingly, a need exists for improved chamber elements, such as a getter support and/or susceptor, that can be made of quartz or other inert materials to serve their respective reactor functions and yet withstand the deterioration that occurs on quartz surfaces near the susceptor.

In an exemplary high temperature process, a reactant gas is passed over the heated substrate, causing the chemical vapor deposition ("CVD") of a thin layer of the reactant material onto a surface of the substrate. As used herein, the terms "processing gas," "process gas," and "reactant gas" generally refer to gases that contain substances, such as silicon-containing gases, to be deposited on a substrate. As used herein, these terms do not include cleaning gases. Through subsequent processes, the layers of reactant material deposited on the substrate are made into integrated circuits. The process gas flow over the substrate is often controlled to promote uniformity of deposition across the top or front side of the substrate. Deposition uniformity can be further promoted by rotating the substrate holder and substrate about a vertical center axis during deposition. The "front side" or "face" of a substrate may refer to the substrate's top surface, which typically faces away from the substrate holder during processing, and the "backside" of a substrate refers to the substrate's bottom surface, which typically faces the substrate holder during processing.

Reference will now be made to the figures, in which like numerals generally refer to like parts throughout. It will be appreciated that the figures are not necessarily to scale. It will further be appreciated that the apparatuses may vary as to configuration and as to details of the parts, and that the methods may vary as to the specific steps and sequence, without departing from the basic concepts as disclosed herein.

Referring to FIGS. 1-8, one embodiment of a reaction chamber 10 for chemical vapor processing and the like is illustrated. As can be seen, the chamber 10 has an elongated, generally flattened configuration which in cross section has a generally lenticular shape. Other shapes, such as a rectangular prism, are possible, and the lenticular shape with opposed biconvex surfaces is for illustrative purposes. The chamber has an upper wall 12, and a lower wall 14 connected by vertically short side rails 16 and 18. The side rails 16, 18 may be taller in some embodiments (e.g., to substantially form a rectangular prism). The side rails 16, 18 may be referred to as "side walls" or "sidewalls". These walls and side rails are further joined by an upstream inlet end flange 20 and a downstream outlet end flange 22. Upstream and downstream relate to the direction of process gas flow, as will be described, and are synonymous in the present description with front and rear. The term "wall" or "sidewall" may be used interchangeably with "boundary" herein. Wall may not be restricted to a generally vertical component but may additionally or alternatively refer to a generally horizontal component, and the walls described herein can be any suitable shape to form a chamber boundary defining a deposition chamber. For example, the chamber boundaries can define a generally horizontal chamber passage configured to conduct gas flow along a gas flow direction therethrough.

The chamber height can be less than the chamber width. In this respect, a longitudinal direction for the chamber 10 extends from the inlet end flange 20 to the outlet end flange 22, or along the section line 3-3. A lateral direction extends between the short side rails 16 and 18, or along the section line 2-2. The height direction is perpendicular to both the longitudinal and lateral axes. Looking at the end view of FIG. 2, the chamber 10 has a major dimension extending between the side rails 16 and 18, and a minor dimension extending between the apexes of the upper and lower walls 12, 14.

Figure 4:
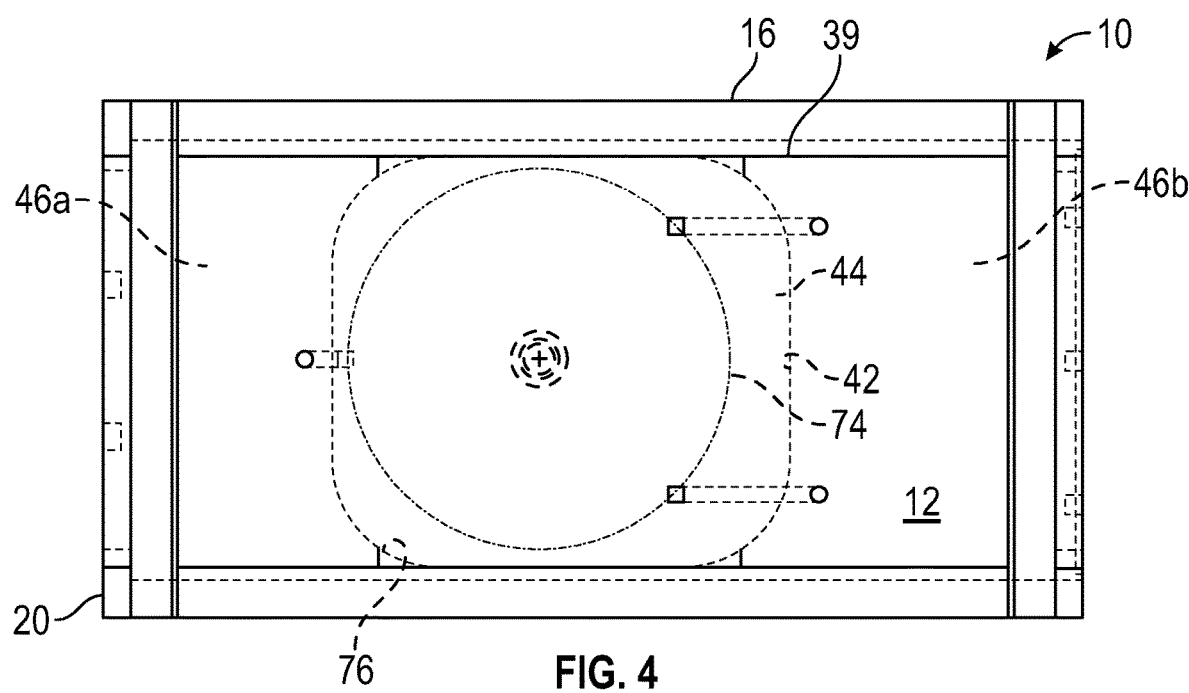
FIG. 4 is a top plan view of the chamber of FIG. 1.
Figure 6:
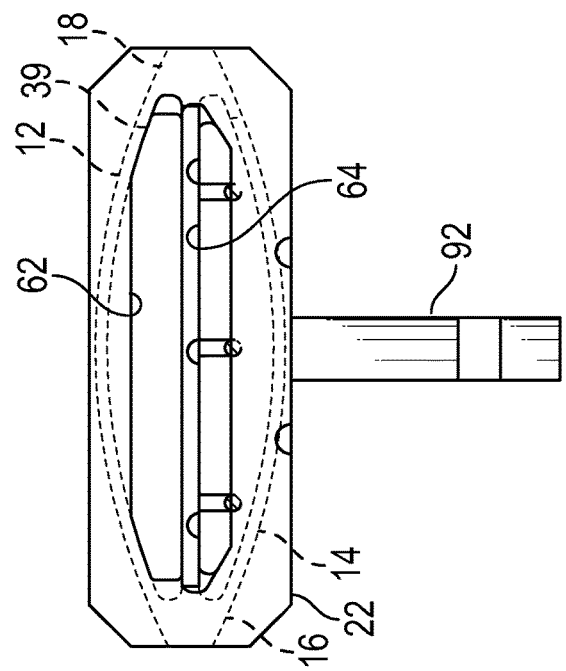
FIG. 6 is a view of the outlet end of the chamber of FIG. 1.
Figure 5:
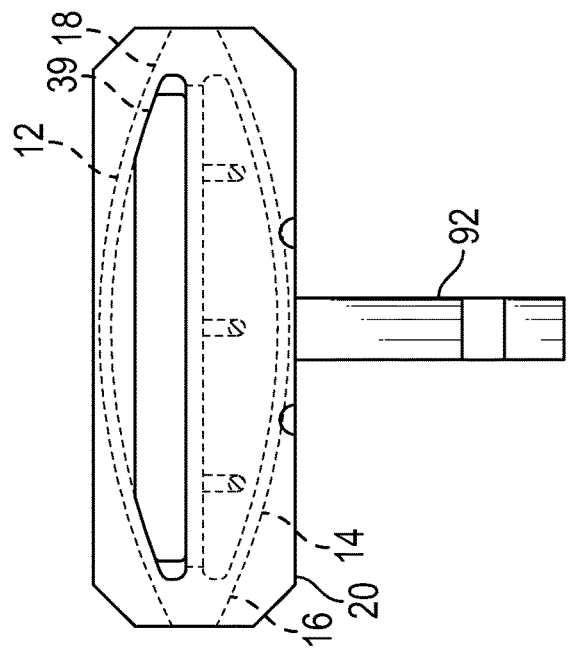
FIG. 5 is a view of the inlet end of the chamber of FIG. 1.
Figure 7:
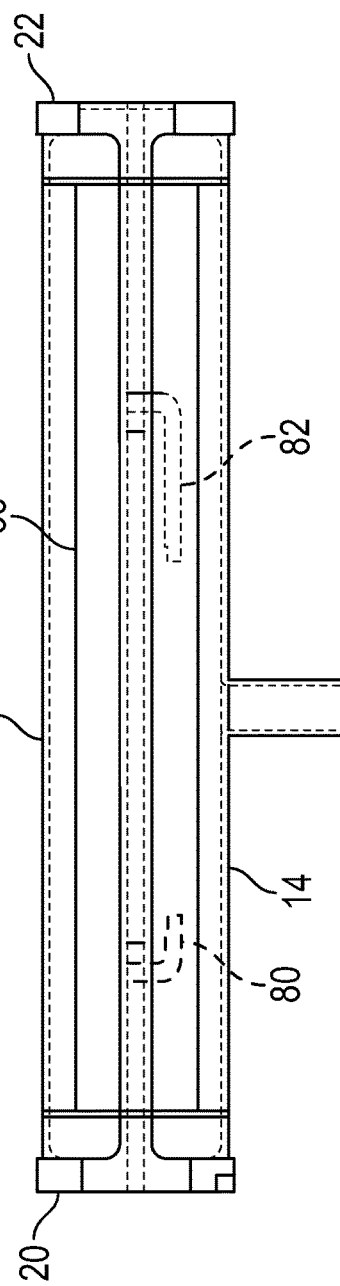
FIG. 7 is a side elevational view of the chamber of FIG. 1.

With reference to FIG. 4, both the upper wall 12 and the lower wall 14 may be thin, curved plate-like elements having a rectangular flat vertical projection. The walls 12 and 14 may, in some embodiments, have a circular radius of curvature and may be formed by segments cut from a cylindrical tube made of quartz or similar material. In larger chambers, the walls 12 and 14 may be constructed by heating and forming flat quartz plates. Unwanted stresses are introduced in curved walls with varying radii and thus a circular wall with a constant curvature can be implemented.

In some embodiments, the upper wall 12 and lower wall 14 have a radius of curvature of approximately 24 inches. In some embodiments, one or both of the upper wall 12 and the lower wall 14 have a thickness of between 4 and 6 millimeters, and more preferably the wall thickness is approximately 5 millimeters. Although quartz is preferred, other materials having similar desirable characteristics may be substituted. Some of these desirable characteristics include a high melting point, the ability to withstand large and rapid temperature changes, chemical inertness, and high transparency to light.

Figure 2:
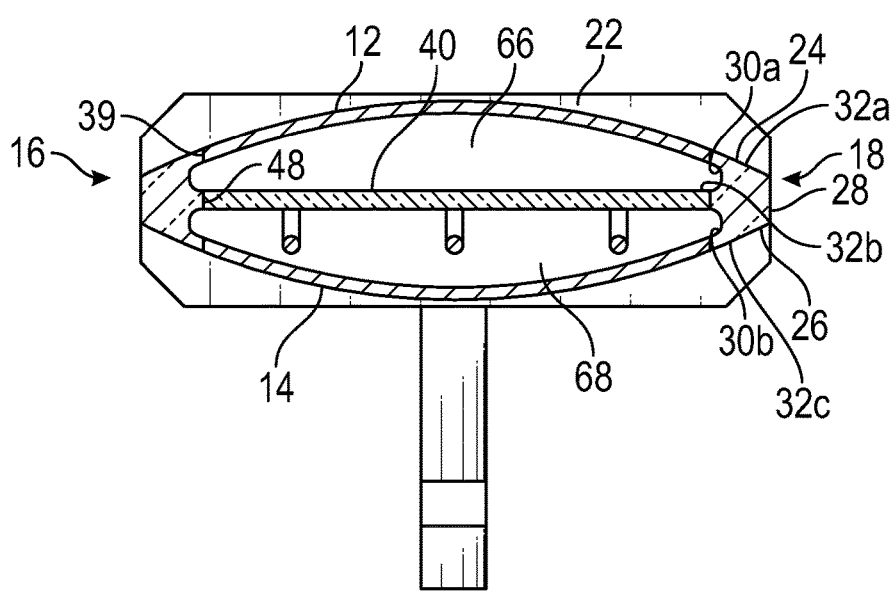
FIG. 2 is a cross-sectional view on line 2-2 of FIG. 1.

The side rails 16, 18 may be machined from a quartz rod of rectangular cross section or otherwise formed into the cross sectional shape illustrated in FIG. 2. More specifically, each side rail 16, 18 can include a reinforced main body having an upper surface 24 that forms a continuation of the curved exterior surface of the upper wall 12, and a lower surface 26 which is curved to form a continuation of the exterior surface of the lower wall 14. The laterally exterior surface 28 of each side rail 16, 18 is flat and extends vertically. The interior surface of each side rail 16, 18 is formed with longitudinally extending upper and lower recesses 30a, 30b that create upper, middle and lower stub wall segments 32a, 32b, 32c, respectively. In the embodiment shown, the upper and lower stub wall segments 32a, 32c mate with the side edges of the upper and lower walls 12 and 14 at longitudinal weld joints 39. In some embodiments, the main body of the side rails 16, 18 has a thickness or width dimension of about 20 mm and a height of about 21 mm.

Figure 3:
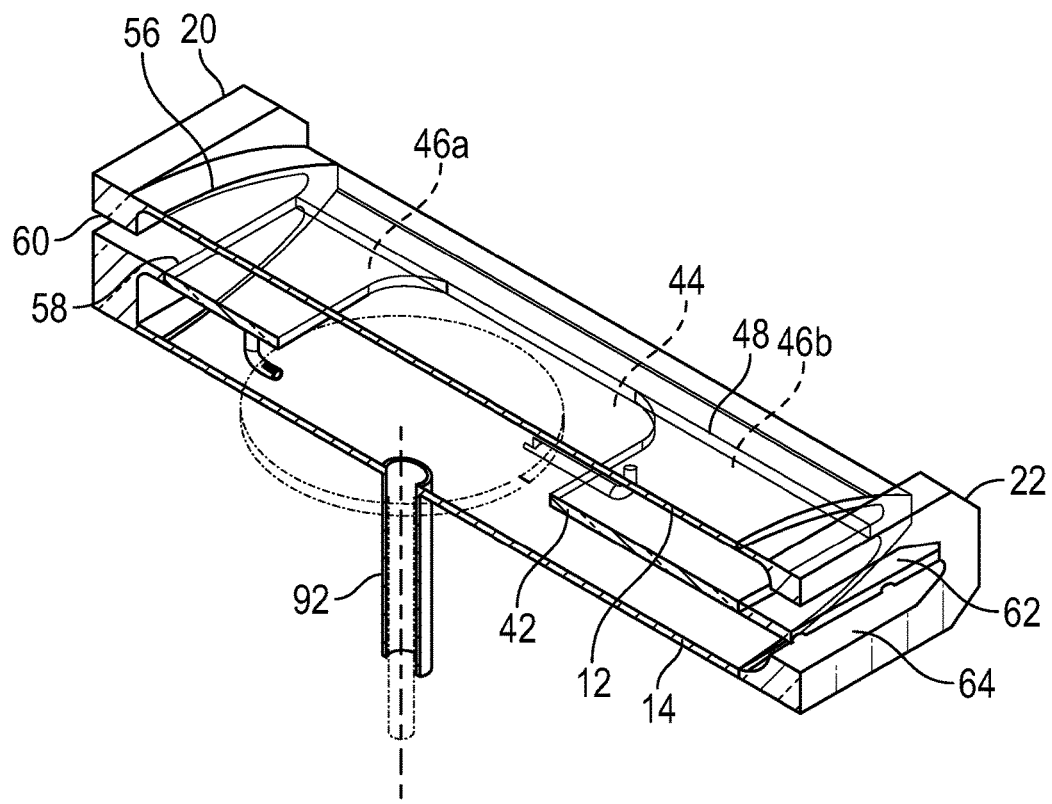
FIG. 3 is a perspective view of one-half of the process chamber from a vertical-longitudinal plane looking along line 3-3 of FIG. 1.

In some embodiments a flat, rectangular support plate 40 can extend between the side rails 16 and 18. As seen in FIG. 3, the support plate 40 includes an aperture 42 defining a void or opening 44 extending across the width of the chamber 10 and dividing the support plate into an inlet section 46a and an outlet section 46b. The inlet section 46a extends from the inlet flange 20 to an upstream edge of the opening 44, and the outlet section 46b extends from a downstream edge of the opening 44 to the outlet flange 22. As may be seen from FIG. 4, the inlet section 46a of the support plate may be shorter in the longitudinal direction than is the outlet section 46b. The inlet section can be, for example, about 70% of the length of the outlet section. That proportional arrangement relates to the process gas flow through the chamber rather than to the strength characteristics of the chamber walls.

As best seen in FIG. 2, each of the side rails 16 and 18 includes the inwardly extending central stub wall 32b that in effect forms an extension of the support plate 40. In this respect, the support plate 40 in practice terminates at the main body of the side rails 16, 18, or, in other words, at the laterally outer extent of the recesses 30a, 30b. Longitudinal joints 48 indicate the welded connection between the lateral edges of the support plate 40 and the central stub walls 32b of each of the side rails 16 and 18.

The central stub walls 32b may bisect the upper and lower walls 12 and 14, and the support plate 40 may thus lie on the centerline or center plane therebetween. This desirable location creates stresses generally within the plane of the plate 40 imposed by lateral displacement of the side rails 16, 18. Such displacement occurs in reduced pressure processing as the walls 12, 14 try to flatten out and exert outward forces thereto.

Referring to FIGS. 1 and 3, each of the end flanges 20, 22 can comprise outer, generally rectangular slabs 50, 51, respectively, having chamfered corners 52 and inner lenticular shaped extensions 54. As seen from FIG. 3, the inner extensions 54 conform to the shapes of the upper and lower walls 12, 14 and the central support plate 40. More particularly, short longitudinal portions extend from the slabs 50 to join with each of these plate-like members. At each end of the chamber 10, curvilinear weld joints 56 are formed between the curved upper and lower walls 12, 14 and the upper and lower portions of the extension 54, while linear joint lines 58 are defined between central portions of the extension 54 and the longitudinal ends of the support plate 40. The slab 50 of the inlet flange 20 includes a laterally extending aperture 60 in an upper portion which leads into a region 66 within the chamber 10 above the support plate 40 and below the upper wall 12. The slab 51 of the outlet flange 22, in contrast, includes a pair of laterally extending apertures 62 and 64. The upper aperture 62 communicates with the upper region 66 of the chamber 10 previously described, while the lower aperture 64 communicates with a lower region 68 of the chamber 10 below the support plate 40 and above the lower wall 14. The rounded recesses 30a, 30b in the side rails 16, 18 define lateral boundaries of the upper and lower regions 66, 68. As will be described below, the wafer processing is done in the upper region 66 only, with the support plate 40 defining the lower boundary of the process zone.

Figure 8:
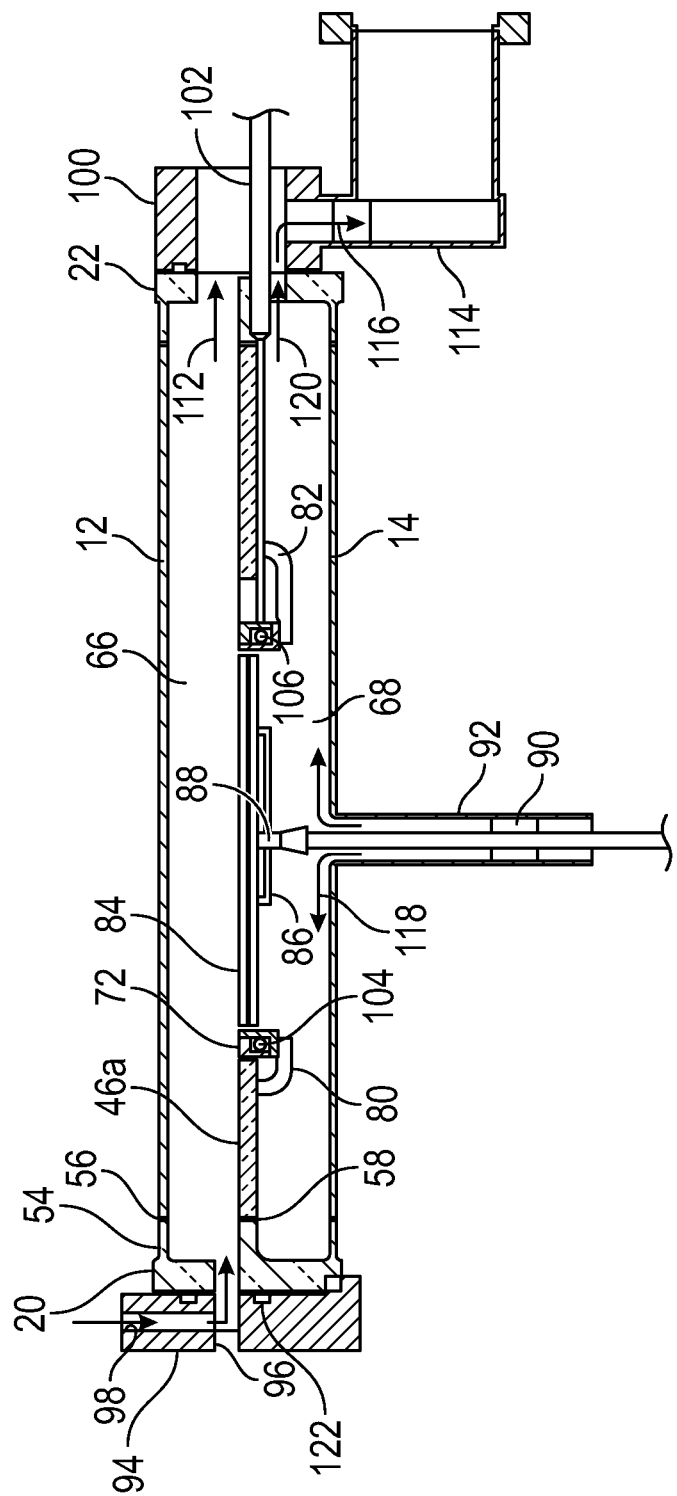
FIG. 8 is a cross-sectional view illustrating the chamber of FIG. 1 connected to a portion of a wafer processing system.

The opening 44 is dimensioned to receive a susceptor 84, as illustrated in FIG. 8, and a temperature compensation ring 72 which surrounds the susceptor. The compensation ring 72 can be referred to as a one-piece ring (OPR). The susceptor 84 can be adapted to rotate within the stationary ring 72 and is preferably spaced therefrom across a small annular gap of about 0.5 to 1.0 mm. The general perimeter of an aperture in the ring 72 which can receive the susceptor is schematically illustrated in FIG. 4 by the broken line circle 74 shown therein. The shape of the aperture 42 in the support plate 40 surrounding the ring 72 can also be circular so that the edges of the opening 44 can be in close proximity to the ring. In some embodiments, a rectangular aperture 42 has rounded corners, as shown in FIG. 4. The support plate sections 46a, 46b may be configured to provide those exact or approximate shapes; or for manufacturing convenience, short, somewhat triangular sections 76 of fill, shown in FIG. 4, may be welded to the plate sections and the chamber side rails 16, 18 to provide the desired configuration. The support plate section 46b may serve as a getter support in some embodiments, as described in more detail below.

As shown in FIG. 4, the circle 74 is not centrally positioned with respect to the upstream and downstream ends of the chamber, or with respect to opening 44. This is because in some embodiments the upstream or leading edge of the circle 74 is closer to the downstream edge of the inlet plate section 46a than is the downstream or trailing edge of the circle 74 to the upstream edge of the outlet plate section 46b. This arrangement may help maintain the strength of the chamber by reducing the rate of devitrification of the upstream edge of the outlet plate section 46b. That is, the gas flow heats up as it passes over the susceptor so that the temperature within the chamber walls tends to be the greatest just downstream from the susceptor. The upstream edge of the outlet plate section 46b can therefore be exposed to significant thermal cycling and devitrification if positioned too close to the susceptor, and thus the susceptor is offset forwardly within the opening 44 to increase the spacing therebetween. In some configurations, this offset arrangement also affects the flow of the process gases through the chamber. The wafer placed upon the susceptor which is surrounded by the ring is positioned close to the downstream edge of the inlet plate section 46a to reduce or minimize the amount of reaction gases which pass through the opening 44 upstream of the wafer. This reduces or minimizes the amount of reaction gas which can deposit underneath the susceptor and/or on the backside of the wafer in the lower portion 68 of the chamber 10.

As seen from FIG. 8, the temperature compensation ring 72 can be supported by one or more (e.g., three) support elements (e.g., elbow-shaped) having vertically extending portions being welded to the support plate sections. In some embodiments, a front support element or finger 80 is welded to the rear of the front plate section midway between the rails 16, 18 of the chamber, and the horizontal portion of the element extends rearwardly into the opening 44 so as to be positioned under the leading edge of the temperature compensation ring 72. A pair of spaced elements or fingers 82 have elongated horizontal portions that extend forwardly beneath the trailing edge of the compensation ring 72 as seen in FIG. 8, as well as FIGS. 2-7. The compensation ring 72 can thus be supported in a horizontal plane at one or more points by upstanding pins (not shown) in the fingers 80 and 82. The pins may eventually deteriorate from repeated thermal cycling and exposure to process and etch gases, but they can be replaced fairly readily.

A susceptor 84 is shown supported on arms 86 of a suitable support 88 connected to the upper end of a rotatable shaft 90 that extends through a tube 92 depending from the bottom wall of the chamber. The susceptor 84 is shown approximately level with the upper edge of the ring 72 and with the upper surface of the support plate 40. This enables a wafer to be positioned above the susceptor 84 and in the upper portion 66 of the process chamber 10.

Still referring to FIG. 8, the inlet flange 20 is adapted to be connected to an inlet component 94 having a horizontally elongated slot 96 through which a wafer may be inserted, and having an elongated inlet 98 for introducing process gas into the upper portion 66 of the chamber after an isolation valve leading from the slot 96 to a wafer handling chamber (not shown) has been closed. Correspondingly, the outlet flange 22 is adapted to mate with an outlet component 100 for exhausting process gas from the chamber 10, as well as applying a vacuum to the chamber. As can be seen from FIG. 8, the outlet flange 22 is open to the lower portion 68 of the chamber beneath the support plate as well as the portion 66 above the support plate.

A plurality of thermocouples 102 may be included that each extend through the outlet component 100 and into the lower portion 68 of the process chamber 10. The thermocouples 102 extend into proximity of the susceptor 84 to sense the local temperature surrounding the susceptor 84 and wafer positioned there above. The advantageous positioning of the sensing ends of the thermocouples 102 surrounding the susceptor 84 allows comprehensive feedback regarding the temperature of the wafer and enables adjustment of radiant heating lamps surrounding the chamber 10 to compensate for temperature irregularities. More particularly, a leading edge thermocouple 104 terminates proximate the front end of the susceptor 84, a trailing edge thermocouple 106 terminates proximate a rear edge of the susceptor and a lateral thermocouple (not shown) terminates proximate a lateral edge of the susceptor. Each of the thermocouples 102 enters the temperature compensation ring 72 which is formed of two parts to provide a hollow interior therein. The temperature compensation ring 72 includes generally L shaped inner and outer bodies which cooperatively define an annular passage through the ring for receiving the thermocouples 102.

Preferably, the temperature compensation ring 72 is constructed of graphite or other such high heat absorbency material. The ring 72 provides several advantages in the processing environment, primarily reducing edge heat losses from the susceptor 84. More specifically, the ring 72 closely surrounds the edge of the susceptor 84 and is maintained at a similar temperature during processing, as the materials are similar. The susceptor and ring thus radiate heat toward one another to effectively cancel any radiant losses therebetween. Another advantage of the temperature compensation ring 72 is preheating and postheating of the reactant gas in the region of the wafer. Specifically, the reactant gas enters the chamber at an ambient, non-reacting temperature and is heated to a temperature suitable for deposition as it passes over the susceptor and wafer. The surrounding temperature compensation ring 72 thus preheats the reactant gas stream before it reaches the leading edge of the susceptor, and, subsequently, the leading edge of the wafer. The process gas may reach an approximately steady state temperature before traveling over the edge of the wafer. The temperature of the gas may not significantly drop off after passing the downstream edge of the wafer as the temperature compensation ring 72 extends the downstream heating region. Further advantages of the temperature compensation ring 72 will be described below with reference to modified rings.

The gas flow through the chamber is shown in FIG. 8. Reactant gas enters through the inlet component 94 with a predetermined lateral velocity profile, such as the profile described in U.S. Pat. No. 5,221,556, which is hereby expressly incorporated by reference. The predetermined velocity profile provides a larger gas flow towards the central portion of the reaction chamber 10 than the laterally outer edges to compensate for the longer deposition travel path over the center of the circular wafer supported on the susceptor 84. A greater amount of reactant gas may be needed over the central portion of the wafer due to reactant depletion along that flow path over the wafer. Further, the cross sectional shape of the chamber 10, as best seen in FIG. 2, accommodates greater gas flow at the center of the chamber where greater reactant gas flow is needed, rather than at the lateral edges where less reactant gas flow is needed.

The reactant gas continues longitudinally rearward as indicated by arrow 112 and exits through the outlet component 100 and downward through exhaust conduits 114, as indicated with arrow 116. Purge gas may be supplied upward through the hollow tube 92 surrounding the shaft 90, the tube being sized to provide a gas passage surrounding the shaft. The purge gas enters the lower portion 68 of the chamber 10 as indicated by arrows 118. The purge gas prevents unwanted deposition of particulates underneath the susceptor 84 and exits through the lower longitudinal aperture 64 in the outlet flange 22, as indicated by arrow 120. The purge gas then mixes with the spent reaction gas and continues down along the path of arrow 116 through the exhaust conduits 114. In some embodiments, purge gas can be supplied through an opening in the lower portion of the chamber (e.g., on the left hand side as shown), and flow from the left to the right, exiting through the aperture 64 and exhaust 114.

The end flanges 20, 22 are preferably translucent and fabricated from quartz having nitrogen bubbles dispersed therein. The central thin walls 12, 14 and support plate 40, on the other hand, are transparent to radiant energy, allowing radiant heating of the susceptor and wafer in the chamber 10, without creating high temperatures in these structures. The translucent flanges 20, 22 scatter radiant energy to reduce "light-piping" therethrough. This protects O-rings 122 outside of the flanges 20, 22 from exposure to extreme temperatures generated within the chamber 10. Preferably, a section of the tube 92 below the lower wall 14 is similarly translucent from nitrogen bubbles dispersed therein.

The chamber 10 may utilize rectangular cross-sectional chambers, which may increase the utility of a low, wide shape. A rectangular chamber shape can beneficially enable the wafers to be inserted from one end, and enable replacement susceptors and/or rings to be inserted from the other end of the chamber. Such an arrangement may additionally or alternatively enables the gas flow to be introduced from end-to-end through the chamber with the gas flowing above the internal support plate approximately aligned with the wafer to be processed within the chamber.

Modified Rings and Getter Support Elements

As noted above, devitrification can problematically occur within a reaction chamber, particularly downstream of the susceptor, which may radiate the most heat within the reaction chamber during use. Some solutions to reducing devitrification downstream of the susceptor are described herein. A getter support element (e.g., the outlet support section 46b) and/or a susceptor support ring (e.g., the stationary ring 72 described above), and/or other elements described below, may be modified to reduce the devitrification described above.

In some embodiments, one or more elements can include (e.g., be coated with) a non-crystalline material that is resistant to devitrification. The non-crystalline material may be a semiconductor, such as silicon carbide (SiC). The one or more elements may be substantially or fully formed from this material. However, in some embodiments, the one or more elements may be coated with one or more layers of the material.

For example, a getter support (e.g., the outlet support section 46b described above) may be coated with SiC. Because SiC is resistant to devitrification, the coated getter support can advantageously prevent devitrification of the getter support while simultaneously performing the other functions that a getter support formed from quartz serve (e.g., high melting point, ability to withstand large and rapid temperature changes, chemical inertness). While quartz is also generally transparent to radiant heat energy, which makes it an advantageous material for the walls of the reaction chamber (as described above), the getter support does not rely on its transparency to perform its function. Instead, the getter support serves to prevent reactant gas from entering the lower portion of the reaction chamber (e.g., the lower portion 68 of the chamber 10 described in FIG. 8) while also supporting a getter plate within the reaction chamber. As noted above, the getter plate can absorb the thermal radiation to reduce coating of the chamber walls and other chamber elements. Thus, a SiC-coated getter support can perform most or all of the functions that a quartz getter support previously performed, while also reducing or altogether avoiding devitrification thereof.

A thickness of the coating of material may be sufficiently thick to reduce the likelihood of penetration which could expose the material below the coating, while also not being thicker than necessary to avoid excess cost of manufacture. For example, SiC tends to be an expensive material, so a balancing of thickness of coating may be advantageous. The thickness of the coating may be therefore about 5 microns, about 10 microns, about 15 microns, about 20 microns, about 25 microns, about 30 microns, about 40 microns, about 50 microns, about 60 microns, about 70 microns, about 80 microns, about 90 microns, about 100 microns, about 120 microns, about 140 microns, about 150 microns, about 180 microns, about 200 microns, about 250 microns, any value therein, or fall within a range having endpoints of any of these values therein. For example, in some embodiments the thickness is between about 100 microns and about 120 microns. In some embodiments, the thickness of the coating may be at least as thick as one of the values above. For example, in some embodiments the coating is at least about 50 microns thick. The material on which the coating is layered may be graphite.

Figure 9:
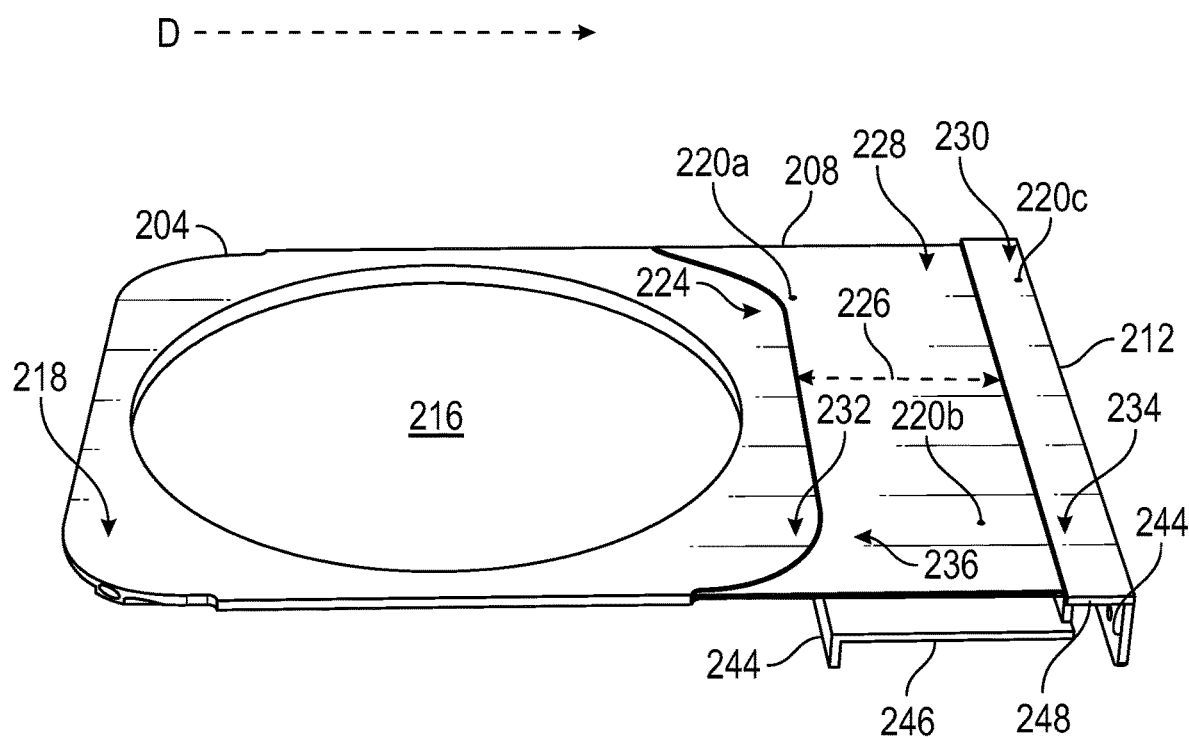
FIG. 9 shows a top perspective view of an example reaction chamber assembly that includes a susceptor support ring, a getter support, and a getter support shelf.

FIG. 9 shows a top perspective view of an example reaction chamber assembly that includes a susceptor support ring 204, a getter support 208, and a getter support shelf 212. The susceptor support ring 204 may correspond to and/or include one or more features of the ring 72 described above. The getter support 208 may correspond to and/or include one or more features of the outlet support section 46b described above. A direction D of a flow of gas is indicated in FIG. 9. Accordingly "upstream" and "downstream" may be referenced according to the direction D. Thus "upstream" may be synonymous with "front", and "downstream" may be synonymous with "back" or "rear". The susceptor support ring 204 may include an aperture 216 that is adapted to receive a susceptor therein. The aperture 216 may be substantially circular. The aperture 216 may centered approximately centrally within the susceptor support ring 204, but in some embodiments a center of the aperture 216 may be slightly off-center within the susceptor support ring 204 (e.g., as described above with respect to the circle 74 above).

The susceptor support ring 204 may be generally rectangular with rounded corners 232. The downstream rounded corner 232 may generally track a corresponding upstream rounded portion 236 of the getter support 208. As such, the rounded corner 232 can be positioned slightly laterally inwardly, relative to a lateral edge of the ring 204 as shown, such that the lateral edge of the ring 204 is approximately parallel (e.g., collinear) with a corresponding lateral edge of the getter support 208. The rounded corners 232 and/or corresponding upstream rounded portions 236 may be configured to form generally curvilinear transverse portions of edges of the respective component. The susceptor support ring 204 and the getter support 208 may be configured such that a gap 224 may be formed between the susceptor support ring 204 and the getter support 208. In some embodiments a maximum distance across the gap 224 may be small enough to avoid allowing reactant gas from passing into a lower portion of the chamber, while still providing thermal isolation between the susceptor support ring 204 and the getter support 208. The maximum distance can be about 0.5 mm, about 1 mm, about 2 mm, about 3 mm, about 4 mm, about 5 mm, about 6 mm, about 7 mm, about 8 mm, about 9 mm, about 10 mm, about 11 mm, about 12 mm, any value therein, or fall within a range having any of these values as endpoints. For example, in some embodiments, the maximum distance is between about 1 mm and 10 mm. The maximum distance can be optimized for each embodiment depending on the need. The larger the maximum distance, the greater the reduction in downstream devitrification. On the other hand, the larger the maximum distance, the greater the amount of reactant gas will be able to pass to a lower part of the reaction chamber, which can cause impurities and deposits on the underside of elements within the reaction chamber (as mentioned above).

The rounded corner 232 and/or the rounded portion 236 of the getter support 208 can have a radius of curvature (e.g., a curvature corresponding to a radius) of about 30 mm, about 35 mm, about 40 mm, about 50 mm, about 60 mm, about 65 mm, about 70 mm, about 80 mm, about 90 mm, any value therein, or falling within a range having any of these values having endpoints therein. For example, in some embodiments the radius of curvature is between about 50 mm and about 80 mm.

The getter support 208 may advantageously have a width 226 along the longitudinal direction D and in a central portion of the getter support 208. The width 226 may be an important consideration based on a number of factors. The width 226 may advantageously extend at a value high enough to allow for the reactant gas to sufficiently cool down before coming in contact with the getter support shelf 212, to reduce the likelihood of devitrification. On the other hand, a longer width 226 puts structural stresses on components within the reaction chamber. Accordingly, the width chosen above will depend on a variety of factors, including the type of equipment to be used, the processing temperatures to be used, the dimensions of the reaction chamber, and the materials of the reaction chamber components. The width 226 may be about 1 mm, about 5 mm, about 10 mm, about 20 mm, about 30 mm, about 50 mm, about 60 mm, about 80 mm, about 100 mm, about 120 mm, about 150 mm, about 175 mm, about 180 mm, about 200 mm, about 250 mm, about 280 mm, about 300 mm, about 350 mm, about 400 mm, about 450 mm, about 500 mm, any value therein, or fall within a range having any of these values as endpoints therein. For example, in some embodiments the width 226 is between about 1 mm and about 150 mm. The getter support shelf 212 may comprise quartz, so the getter support shelf 212 may be susceptible to devitrification if the width 226 is too short.

As shown, the system may include a getter support shelf 212 that is configured to support at least in part the getter support 208 thereon. As noted above, due to certain restrictions (e.g., cost of manufacture), not all components within the reaction chamber may include (e.g., be coated with) the inert material (e.g., SiC). For example, the getter support shelf 212 may comprise uncoated quartz (e.g., may consist essentially of or consist of quartz).

The getter support shelf 212 may advantageously be included to allow the getter support 208 to be supported without requiring it to contact another quartz component within the upper chamber. A getter support 208 may be supported, for example, by sidewalls of the reaction chamber (which may themselves be quartz). However, in embodiments where the getter support 208 comprises a material, such as graphite, that is coated with an inert material (e.g., SiC), the getter support 208 may become hotter than such a getter support 208 made of another material (e.g., quartz), which may cause devitrification at any couplings (e.g., attachments, supports) between the getter support 208 and the quartz reaction chamber wall within the upper portion of the reaction chamber. Accordingly, the embodiment shown in FIG. 9 allows the getter support 208 to be supported within the reaction chamber by the getter support shelf 212 without needing to be supported by any wall within the reaction chamber. Thus, the getter support 208 may have a lateral dimension that is less than an interior lateral dimension (e.g., a lateral distance between opposing sidewalls) of the reaction chamber. Additionally or alternatively, the getter support 208 may not contact one or both lateral walls of the reaction chamber in order to avoid or reduce this devitrification risk.

The getter support shelf 212 may include an upper portion 248, a lower portion 246, a support portion 247 (not shown in FIG. 9), and one or more legs 244. These are described in more detail below. A gap 234 may be formed between the getter support 208 and the getter support shelf 212. The gap 234 may be implemented to thermally isolate a selected portion of the support shelf 212 and the getter support 208. For example, a longitudinal gap can be positioned between the upper portion 248 and the getter support 208 as shown in FIG. 9. In some embodiments a maximum distance across the gap 234 may be selected to be large enough provide thermal isolation, yet small enough to avoid allowing reactant gas from passing into a lower portion of the chamber across the gap 234. For example, the maximum distance can be about 0.5 mm, about 1 mm, about 2 mm, about 3 mm, about 4 mm, about 5 mm, about 6 mm, about 7 mm, about 8 mm, about 9 mm, about 10 mm, about 11 mm, about 12 mm, any value therein, or fall within a range having any of these values as endpoints. For example, in some embodiments, the maximum distance is between about 1 mm and 10 mm.

A face 230 of the getter support shelf 212 may be approximately coplanar with a face 218 of the susceptor support ring 204 and/or with a face 228 of the getter support 208. Additionally or alternatively, the face 218 of the getter support 208 may be approximately coplanar with the face 228 of the getter support 208. Coplanar faces may promote laminar flow of the reactant gas across a corresponding gap 224, 234 while reducing a flow of reactant gas to the lower portion of the chamber across that gap.

An edge of the susceptor support ring 204 and/or getter support 208 (e.g., of the rounded corner 232 and/or the rounded portion 236) can be sloped or curved (e.g., into the faces 218/228, and/or into the underside of the support ring 204 and/or getter support 208), to form a chamfer. For example, the chamfer can be on lower edge of the rounded corner 232 and/or the rounded portion 236. The chamfer can advantageously create additional separation from the portions of the getter support 208 that may otherwise be susceptible to devitrification and thus further reduce the devitrification, while also maintaining a relatively smaller gap 224 between the susceptor support ring 204 and the getter support 208 and thus reducing the flow of reactant gas to the lower part of the chamber. The chamfer can have a width of about 0.5 mm, about 1 mm, about 2 mm, about 3 mm, about 4 mm, about 5 mm, about 6 mm, any value therein, or falling within a range of any of these values having endpoints therein. For example, in some embodiments the width of the chamfer is between about 1 mm and about 4 mm.

The getter support 208 and/or the getter support shelf 212 may include one or more recesses 220a, 220b, 220c. The one or more recesses 220a, 220b, 220c may be configured to receive corresponding one or more getter support elements therein. The one or more support elements can support a getter (not shown in FIG. 9; see, e.g., FIG. 14) thereon. The material of each of the getter support elements may be the same or different, relative to each other. In some embodiments, the material of the getter support element may be selected based upon which of the one or more recesses 220a, 220b, 220c the respective getter support element is coupled. For example, the material of any getter support element may substantially include the material of the corresponding component having the corresponding one or more recesses 220a, 220b, 220c. For example, a first getter support element coupled to a first recess 220a in the getter support 208 may be graphite coated with an inert material (e.g., SiC). A second getter support element coupled to a second recess 220b may have include the same material as the first getter support element. Additionally or alternatively, a third getter support element coupled to a third recess 220c within the getter support shelf 212 may have a material that corresponds to a material of the getter support shelf 212, such as quartz. If the material of the getter support element is substantially similar to a material of the corresponding getter support 208 and/or getter support shelf 212, this may further reduce any devitrification risk that may be associated with putting thermally conductive materials (e.g., graphite) in close proximity or even contact with quartz. Although the embodiment shown in FIG. 9 contemplates two getter support elements coupled to the getter support 208 and one getter support element coupled to the getter support shelf 212, this is only by way of example. Other configurations and numbers of getter support elements (and their corresponding recesses) are possible.

Figure 10:
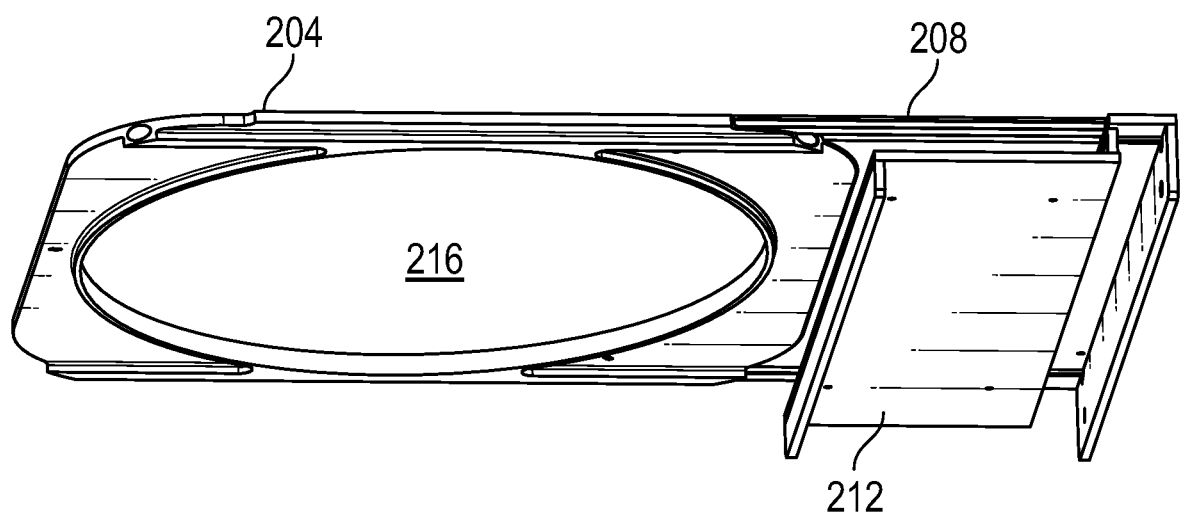
FIG. 10 shows a bottom perspective view of the assembly of FIG. 9.
Figure 11:
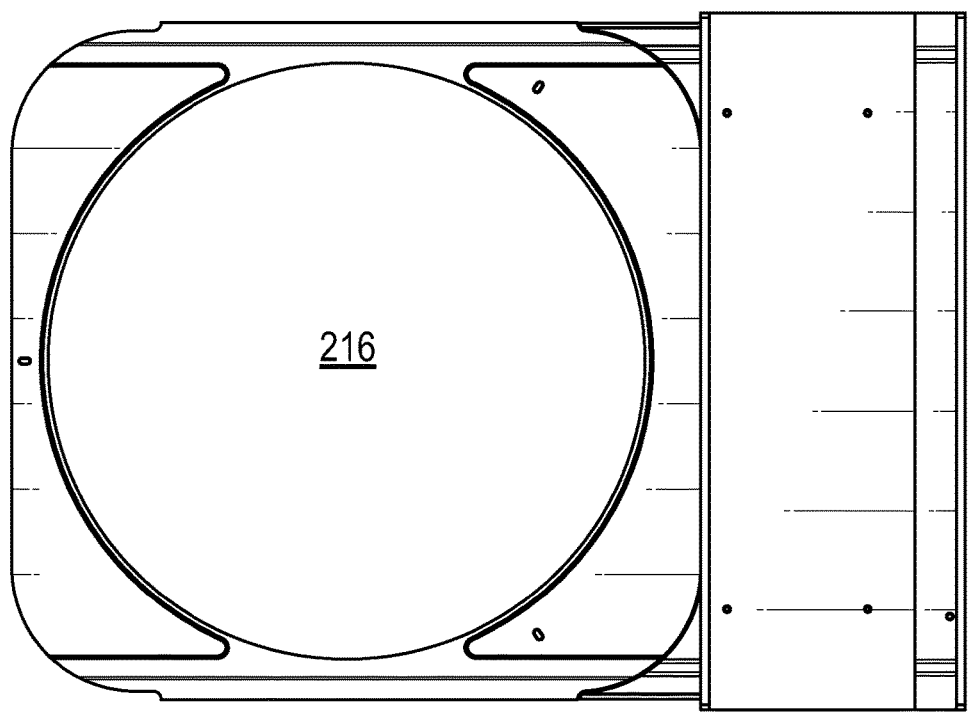
FIG. 11 shows a bottom view of the assembly of FIG. 9.
Figure 12:
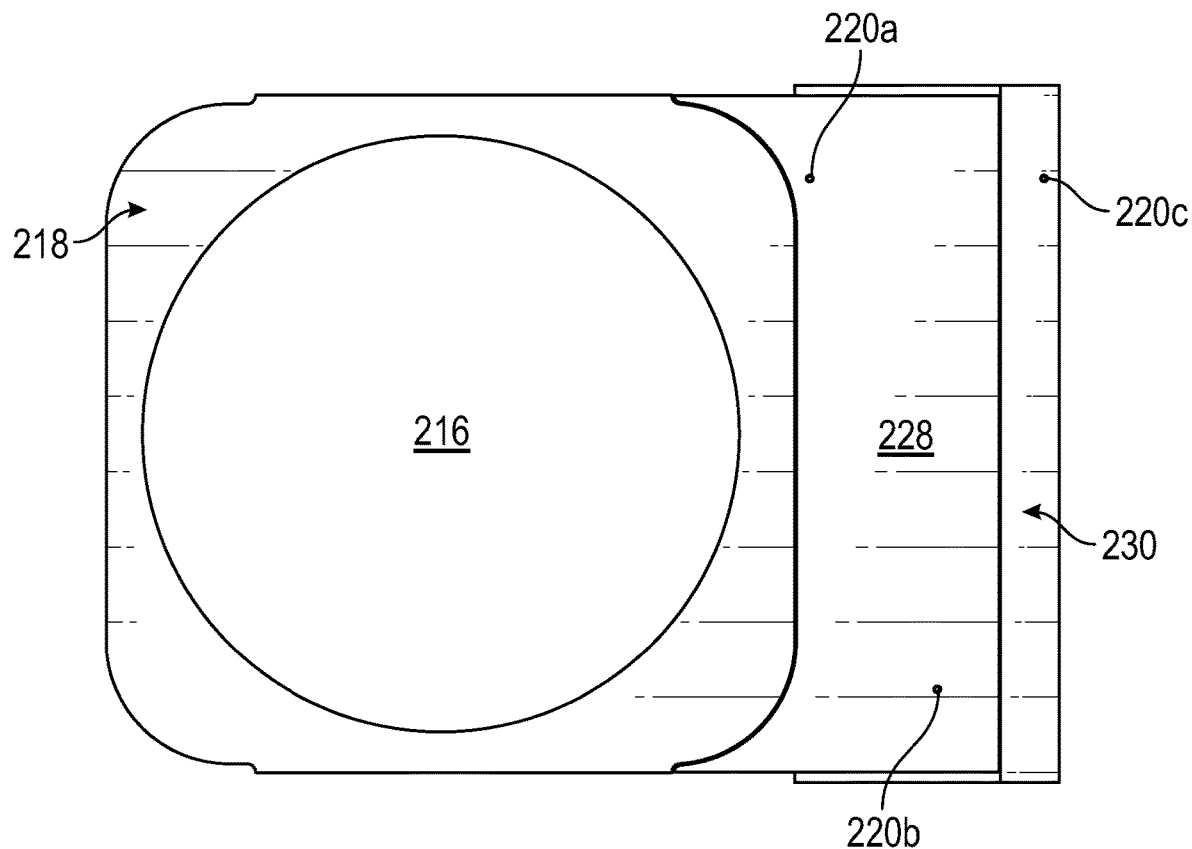
FIG. 12 shows a bottom top view of the assembly of FIG. 9.

FIGS. 10-13 show various views of the assembly shown in FIG. 9 to provide additional information related to the structure of some of the components described above. FIG. 10 shows a bottom perspective view of the assembly. FIG. 11 shows a bottom view, FIG. 12 shows a top view, and FIG. 13 shows a right side view. As shown in FIG. 12, the getter support shelf 212 may have a greater lateral dimension than the getter support 208. In some embodiments, the getter support shelf 212 is coupled to sidewalls of the reaction chamber while the getter support 208 may not be.

As shown in FIG. 13, the lower portion 246 of the getter support shelf 212 may be substantially parallel to the upper portion 248. Additionally or alternatively, the lower portion 246 may be substantially wider (along the direction D) than the getter support shelf 212, although each may have a substantially similar lateral dimension. One or more legs 244 may be coupled to corresponding portions 246, 248 of the getter support shelf 212. A support portion 247 may connect the lower portion 246 to the upper portion 248 and may be substantially perpendicular to the lower portion 246 and/or to the upper portion 248. One or more of the legs 244 may extend the lateral dimension of the getter support shelf 212, although other options are possible.

The getter support shelf 212 may support the getter support 208 via one or more support elements 240. The one or more support elements 240 may include rods, posts, or other support structure. As shown, four support elements 240 support the getter support 208, but other numbers of support elements 240 are possible. Each of the one or more support elements 240 may be coupled between corresponding recesses within an upper face of the lower portion 246 and/or a back face (bottom side) of the getter support 208. The support elements 240 can be configured to rest upon a portion of the getter support shelf 212, such as lower portion 246 as shown.

FIG. 14 shows a right view of the assembly of FIG. 9 with an example getter plate 250. The getter plate 250 may be supported by one or more support elements 254a, 254b, 254c. Each of the support elements 254a, 254b, 254c may couple to (e.g., fit within) corresponding recesses 220a, 220b, 220c described above. The getter plate 250 may be substantially planar and may be parallel with more of the susceptor support ring 204, the getter support 208, and/or a face 230 of the getter support shelf 212. In some embodiments, the getter plate 250 extends further upstream than does the getter support 208 such that the getter plate 250 at least partially longitudinally overlaps with (e.g., "covers") a portion of the susceptor support ring 204. The getter plate 250 may comprise graphite, but other materials are possible. As noted above, the one or more support elements 254a, 254b, 254c may comprise a material that corresponds to a material of the component to which the respective support element is coupled.

Figure 15:
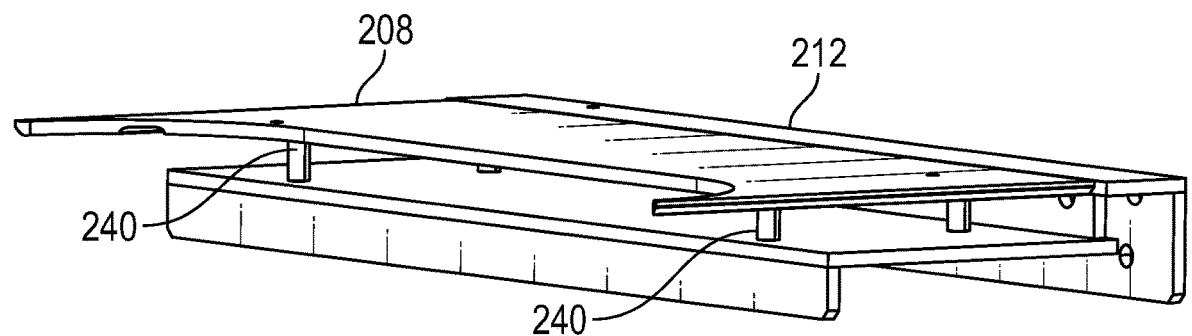
FIG. 15 shows a top perspective view of the getter support and the getter support shelf of FIG. 9 but without the susceptor support ring.

FIG. 15 shows a top perspective view of the getter support 208 and the getter support shelf 212 (without the susceptor support ring 204). As shown, the getter support shelf 212 may support the getter support 208 on four support elements 240.

Figure 16:
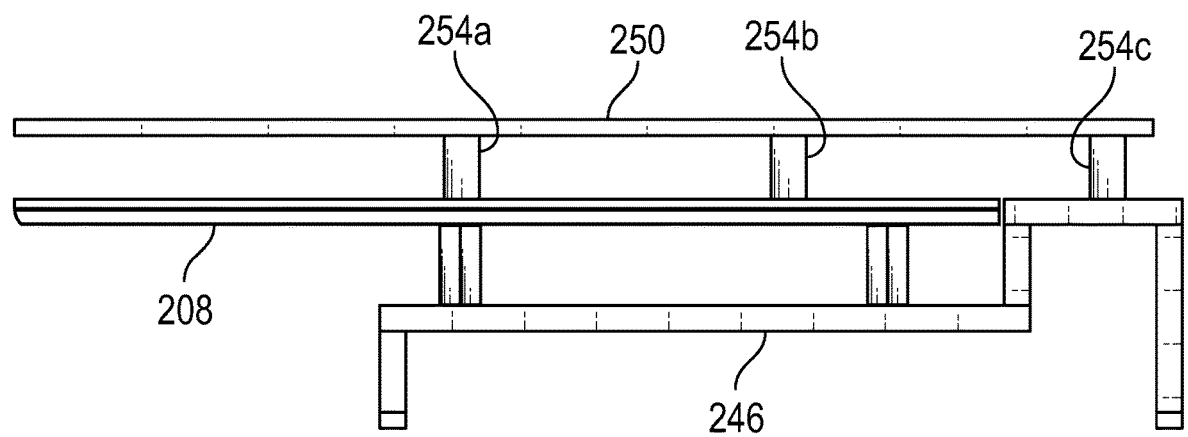
FIG. 16 shows a side view of the getter support, the getter support shelf, and the getter plate of FIG. 14 but without the susceptor support ring.

FIG. 16 shows a side view of the getter support 208, the lower portion 246 of the getter support shelf 212, and the getter plate 250 (without the susceptor support ring 204). The getter plate 250 may be disposed within the reaction chamber generally horizontal. Additionally or alternatively, the getter support 208 and the face 230 of the getter support shelf 212 may be generally horizontal.

Figure 17:
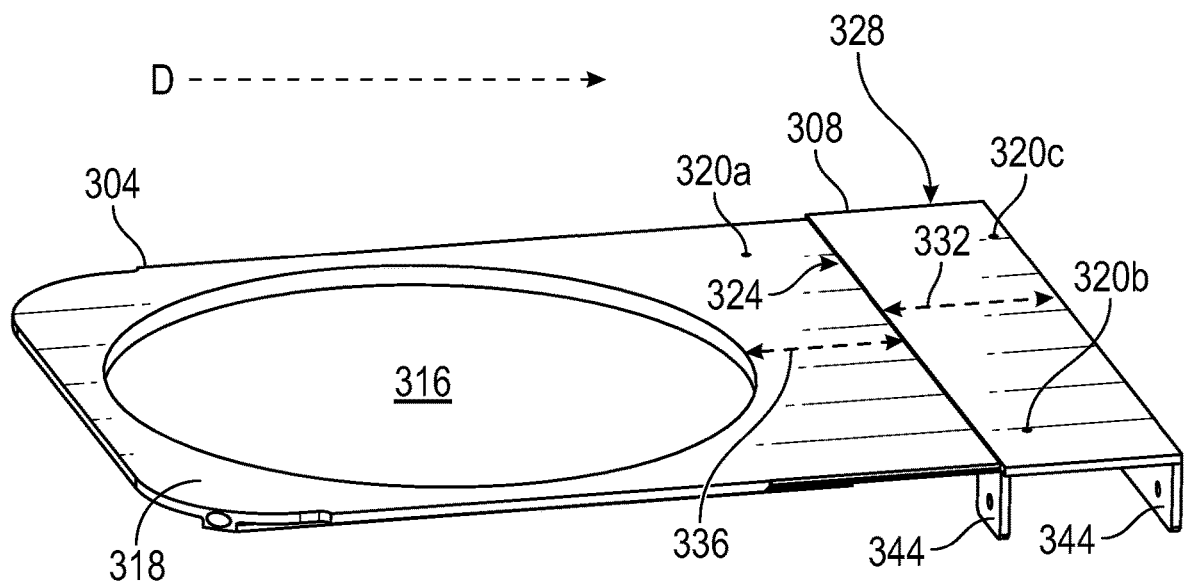
FIG. 17 shows a top perspective view of another embodiment of a susceptor support ring and a getter support.

FIG. 17 shows a top perspective view of another embodiment of a susceptor support ring 304 and a getter support 308. The susceptor support ring 304 may reduce devitrification by implementing a selected downstream width 336 (from the aperture edge to the downstream edge of the support ring 304 along direction D) of the susceptor support ring 304, which can allow the reactant gas to cool sufficiently before coming in contact with the getter support 308 to avoid or reduce an occurrence of devitrification of the getter support 308. The susceptor support ring 304 may be generally formed of (e.g., comprise, consist essentially of, or consist of) graphite and the getter support 308 may be generally formed of (e.g., comprise, consist essentially of, or consist of) quartz.

An aperture 316 may be substantially evenly or unevenly positioned within the within the susceptor support ring 304. For example, the width 336 along the direction D may be greater than a corresponding dimension from the aperture edge to the outer lateral edge of the susceptor support ring 304, as shown. The aperture 316 can be longitudinally positioned off-center within the susceptor support ring 304 to allow for a greater width 336 as noted above. Thus, the width 336 along the direction D can be a greater distance than the corresponding upstream width along direction D from the aperture edge to the upstream edge of the ring 304. The positioning and configuration of the aperture 316 can be implemented within other embodiments herein.

The susceptor support ring 304 may be different shapes (e.g., generally square or rectangular). Additionally or alternatively, the aperture 316 may be substantially circular. The susceptor support ring 304 may include one or more features of the susceptor support ring 204 described above. Additionally or alternatively, the getter support 308 may include one or more features of the getter support 208 described above.

The downstream width 336 of the susceptor support ring 304 may describe a minimum distance from the edge of the aperture 316 to a downstream edge of the susceptor support ring 304. The minimum distance may be about 1 mm, about 5 mm, about 10 mm, about 20 mm, about 30 mm, about 50 mm, about 60 mm, about 80 mm, about 100 mm, about 120 mm, about 150 mm, about 175 mm, about 180 mm, about 200 mm, about 250 mm, about 280 mm, about 300 mm, about 350 mm, about 400 mm, about 450 mm, about 500 mm, any value therein, or fall within a range having any of these values as endpoints therein. For example, in some embodiments the width 336 is between about 1 mm and 150 mm. The width 336 may be an important consideration based on a number of factors. For example, the longer the width 336, the greater the reduction in devitrification generally. On the other hand, a longer width 336 puts structural stresses on components within the reaction chamber. Accordingly, the width chosen above will depend on a variety of factors, including the type of equipment to be used, the processing temperatures to be used, the dimensions of the reaction chamber, and the materials of the reaction chamber components.

The getter support 308 may be configured to support at least in part a getter plate (not shown in FIG. 17). The getter support 308 may cooperate with the susceptor support ring 304 in supporting the getter plate. For example, one or more recesses 320a, 320b, 320c may be included in one or both of the susceptor support ring 304 and/or the getter support 308. Each of the recesses 320a, 320b, 320c may be configured to support corresponding one or more getter support elements (not shown). As described above with reference to the recesses 220a, 220b, 220c, the material of a getter support element may substantially include the material of the element having the corresponding one or more recesses 220a, 220b, 220c. Although the embodiment shown in FIG. 17 contemplates two getter support elements coupled to the getter support 208 and one getter support element coupled to the getter support shelf 212, this is only by way of example. Other configurations and numbers of getter support elements (and their corresponding recesses) are possible.

A face 318 of the susceptor support ring 304 and a face 328 of the getter support 308 may be substantially coplanar with each other. Additionally or alternatively, one or both of the faces 318, 328 may be generally facing up. The face 328 of the getter support 308 may be generally rectangular. In some embodiments, the face 328 may have a shorter downstream longitudinal width 332 than a lateral dimension (e.g., extending from edge to edge) across the entirety of the getter support 308. The longitudinal width 336 of the susceptor support ring 304 may be greater than the longitudinal width 332 of the getter support 308 in some embodiments.

A gap 324 between a downstream edge of the susceptor support ring 304 and an upstream edge of the getter support 308 may be generally small to reduce passage of reactant gas therethrough, but large enough to avoid causing devitrification by the susceptor support ring 304, which may be generally thermally conductive (e.g., graphite), of the getter support 308, which may be formed from quartz. A maximum distance across the gap 324 can be about 0.5 mm, about 1 mm, about 2 mm, about 3 mm, about 4 mm, about 5 mm, about 6 mm, about 7 mm, about 8 mm, about 9 mm, about 10 mm, about 11 mm, about 12 mm, any value therein, or fall within a range having any of these values as endpoints. For example, in some embodiments, the maximum distance is between about 1 mm and 10 mm. The maximum distance can be optimized for each embodiment depending on the need.

The getter support 308 may additionally or alternatively at least partially support the susceptor support ring 304. In some embodiments, the getter support 308 is coupled to one or more sidewalls of the reaction chamber for added structural support. However, in some embodiments, the getter support 308 may be largely or completely supported by a base wall of the reaction chamber via one or more legs 344. A lateral dimension of the getter support 308 may be larger than that of the susceptor support ring 304 since it may not be desirable to have the susceptor support ring 304 come into contact or even close proximity with sidewalls of the reaction chamber since such proximity/contact may cause devitrification of the reaction chamber walls due to the heat radiating from the susceptor support ring 304.

Figure 18:
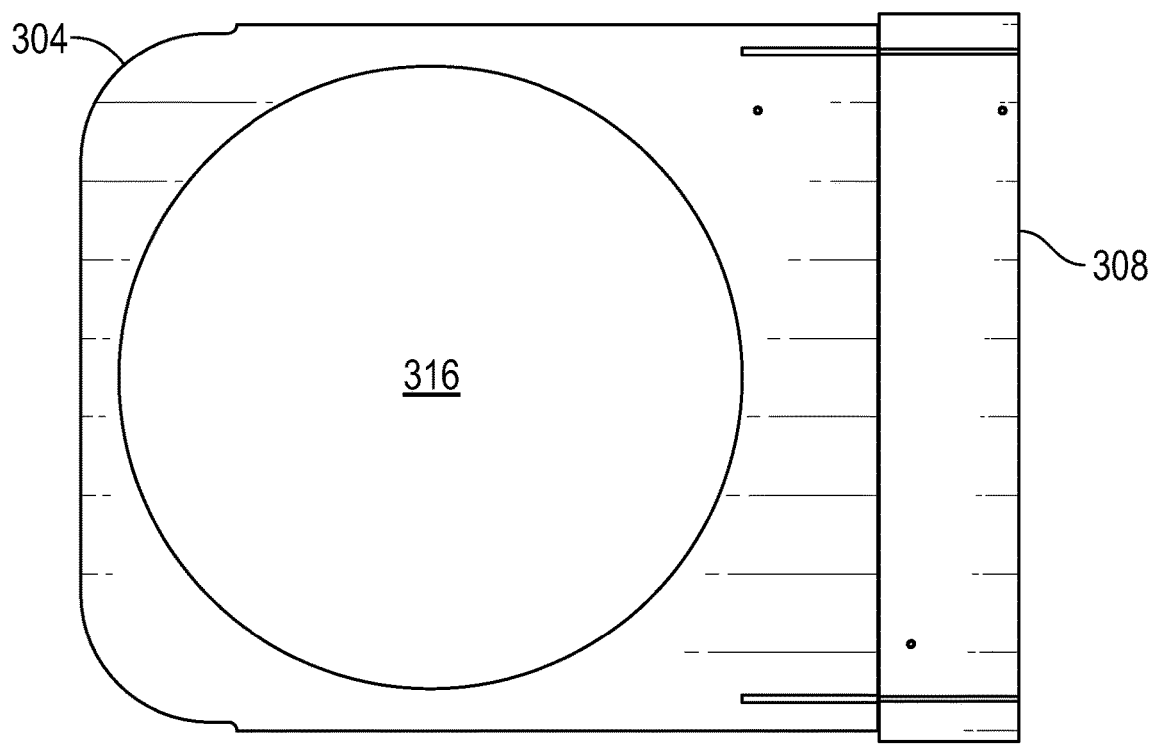
FIG. 18 shows a top view of the assembly of FIG. 17.
Figure 19:
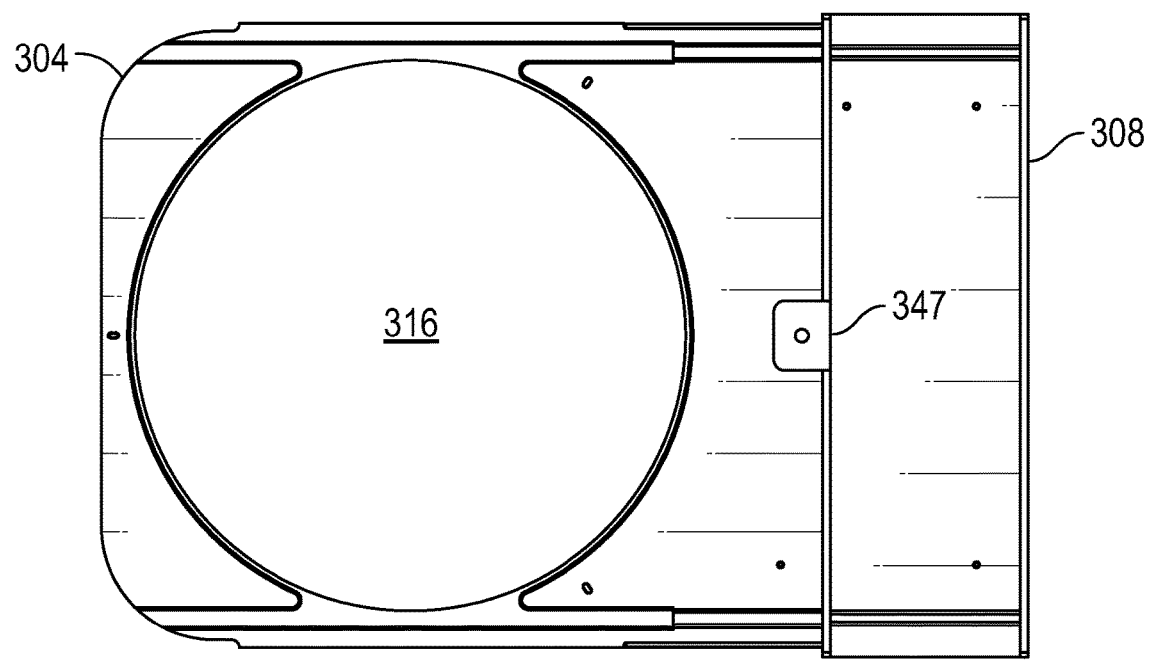
FIG. 19 shows a bottom view of the assembly of FIG. 17.
Figure 20:
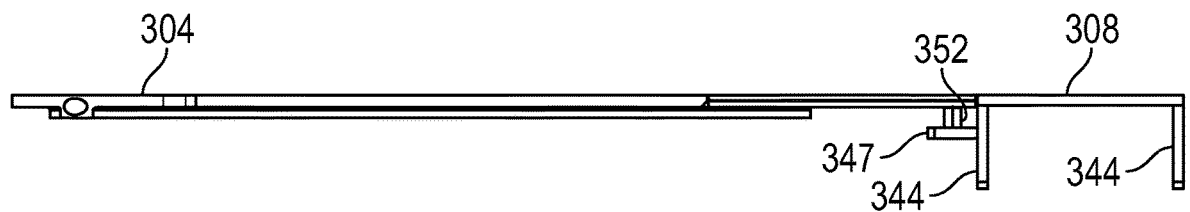
FIG. 20 shows a right view of the assembly of FIG. 17.

FIGS. 18-20 show various views of the assembly shown in FIG. 17. FIG. 18 shows a top view, FIG. 19 shows a bottom view, and FIG. 20 shows a right view of the assembly. As shown in FIG. 19, a support portion 347 of the getter support 308 may be used to couple to and at least partially support the susceptor support ring 304. The support portion 347 may support the susceptor support ring 304 on an underside of the susceptor support ring 304.

As shown in FIG. 20, the support portion 347 of the getter support 308 may couple to a support element 352 (e.g., rod, bar, pillar, etc.) on which the susceptor support ring 304 rests. The support element 352 may couple to corresponding recesses within a top side of the support portion 347 and/or within a bottom side of the susceptor support ring 304.

Figure 21:
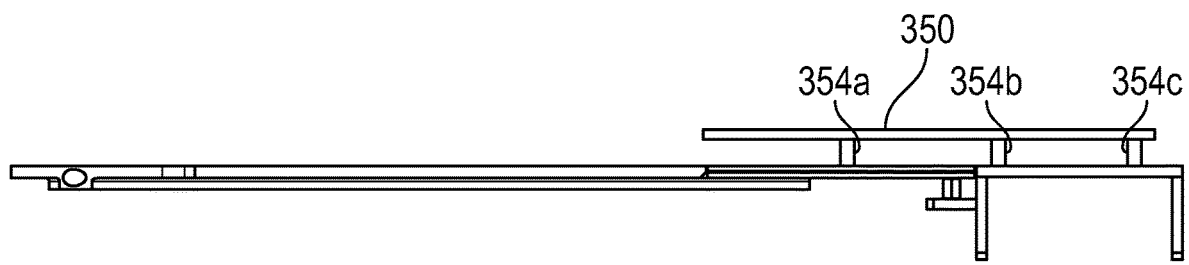
FIG. 21 shows a right view of the assembly of FIG. 17 with an example getter plate.

FIG. 21 shows a right view of the assembly of FIG. 20 with a getter plate 350. The getter plate 350 may be supported by one or more support elements 354a, 354b, 354c. Each of the support elements 354a, 354b, 354c may couple to (e.g., fit within) corresponding recesses 320a, 320b, 320c described above. The getter plate 350 may be substantially planar and may be parallel with one or more of the susceptor support ring 204, the getter support 208, and/or a face 230 of the getter support shelf 212. In some embodiments, the getter plate 350 extends further upstream than does the getter support 208 such that the getter plate 350 at least partially longitudinally overlaps with (e.g., "covers") a portion of the susceptor support ring 204. The getter plate 350 may comprise graphite, but other materials are possible. As noted above, the one or more support elements 354a, 354b, 354c may comprise a material that corresponds to a material of the component to which the respective support element is coupled.

Figure 22:
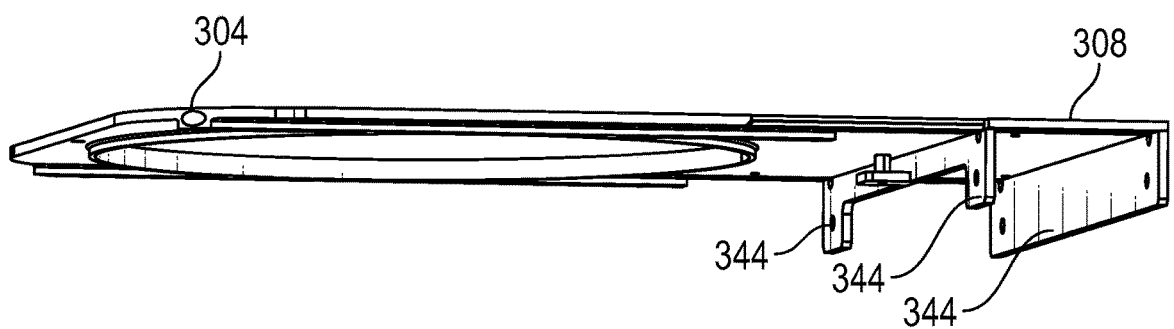
FIG. 22 shows a bottom perspective view of the susceptor support ring and the getter support of FIG. 17.

FIG. 22 shows a bottom perspective view of the susceptor support ring 304 and the getter support 308 of FIG. 17. As shown, the getter support 308 includes three legs 344. Two of the leg 344 do not extend the entire lateral dimension of the getter support 308 whereas a third leg 344 does extend substantially the full lateral dimension. As with the other features shown in FIGS. 1-22, this is shown by way of example only, and other alternatives are possible.

EXAMPLES

Below are a number of nonlimiting examples of embodiments described above.

In a 1st Example, a chemical vapor deposition system comprising chamber boundaries defining a deposition chamber having a deposition gas inlet at an upstream end and a gas outlet at a downstream end, the chamber boundaries defining a generally horizontal chamber passage configured to conduct gas flow along a gas flow direction therethrough, the chamber boundaries comprising quartz, a susceptor configured to support a substrate thereon, the chamber boundaries above the susceptor being generally transparent to radiation energy, a susceptor support ring positioned in the chamber passage between the gas inlet and the gas outlet, a getter plate positioned generally horizontally within the chamber, the getter plate extending generally parallel to the susceptor and extending laterally substantially across the deposition chamber, a getter support comprising a support base and one or more support elements, at least a portion of the getter support and at least one of the one or more support elements comprising a coating comprising silicon carbide (SiC), the getter support being disposed a maximum distance of between about 1 mm and about 10 mm from the susceptor support ring, and a getter support shelf configured to be disposed on a generally horizontal chamber boundary and to at least partially support the getter support.

In a 2nd Example, the Example of Example 1, wherein the getter support shelf comprises one or more recesses in a face thereof, the one or more recesses configured to receive corresponding one or more support elements configured to support the getter plate.

In a 3rd Example, a chemical vapor deposition system comprising chamber boundaries defining a deposition chamber having a deposition gas inlet at an upstream end and a gas outlet at a downstream end, the chamber boundaries defining a generally horizontal chamber passage configured to conduct gas flow along a gas flow direction therethrough, a susceptor configured to support a substrate thereon, the chamber boundaries above the susceptor being generally transparent to radiation energy, a susceptor support ring positioned in the chamber passage between the gas inlet and the gas outlet, a getter plate positioned generally horizontally within the chamber, the getter plate extending generally parallel to the susceptor and extending laterally substantially across the deposition chamber, and a getter support comprising a support base and one or more support elements, at least a portion of the getter support comprising a coating comprising silicon carbide (SiC), the getter support being disposed a maximum distance from the susceptor support ring.

In a 4th Example, the Example of Example 3, wherein the chamber boundaries comprise quartz.

In a 5th Example, the Example of any of Examples 3-4, wherein the maximum distance is between about 1 mm and about 10 mm.

In a 6th Example, the Example of any of Examples 3-5, wherein the getter support comprises a minimum width along a direction of gas flow through the chamber of about 1 mm to about 150 mm.

In a 7th Example, the Example of any of Examples 3-6, wherein the susceptor support ring comprises at least one rounded corner.

In an 8th Example, the Example of any of Examples 3-7, wherein the getter support comprises at least one rounded portion that generally tracks the respective at least one rounded corner and maintains the maximum distance from the susceptor support ring along a length of the at least one rounded corner.

In a 9th Example, the Example of any of Examples 3-8, wherein the rounded portion comprises a radius of curvature of between about 50 mm and about 80 mm.

In a 10th Example, the Example of any of Examples 3-9, wherein an edge of the rounded portion comprises a chamfer.

In an 11th Example, the Example of any of Examples 3-10, wherein the chamfer comprises a width of between about 1 mm and about 4 mm.

In a 12th Example, the Example of any of Examples 3-11, wherein the coating comprises a thickness of at least about 50 microns.

In a 13th Example, the Example of any of Examples 3-12, further comprising a getter support shelf configured to be disposed on a generally horizontal chamber boundary and to at least partially support the getter support.

In a 14th Example, the Example of any of Examples 3-13, wherein the getter support shelf comprises one or more recesses in a face thereof, the one or more recesses configured to receive corresponding one or more support elements configured to support the getter plate.

In a 15th Example, the Example of any of Examples 3-14, wherein the getter support shelf comprises the one or more support elements extending between the getter support and the getter support shelf.

In a 16th Example, the Example of any of Examples 3-15, wherein the getter support shelf is configured not to be coupled to sidewalls of the chamber boundaries.

In a 17th Example, the Example of any of Examples 3-16, wherein the getter support is configured to include a surface that is substantially in the same plane as a surface of the susceptor support ring and a surface of the getter support shelf.

In an 18th Example, the Example of any of Examples 3-17, wherein the getter support comprises an upstream edge shape that generally conforms to a corresponding downstream edge shape of the susceptor support ring.

In a 19th Example, the Example of any of Examples 3-18, wherein the getter support comprises one or more recesses configured to receive corresponding one or more support elements configured to support the getter plate.

In a 20th Example, the Example of any of Examples 3-19, wherein the one or more recesses is two recesses.

In a 21st Example, a chemical vapor deposition system comprising chamber boundaries defining a deposition chamber having a deposition gas inlet at an upstream end and a gas outlet at a downstream end, the chamber boundaries defining a generally horizontal chamber passage configured to conduct gas flow along a gas flow direction therethrough, a susceptor configured to support a substrate thereon, the chamber boundaries above the susceptor being generally transparent to radiation energy, a susceptor support ring positioned in the chamber passage between the gas inlet and the gas outlet, the susceptor support ring comprising an aperture having a center that is disposed nearer to an upstream edge of the susceptor support ring than to a downstream edge, the susceptor support ring comprising first one or more recesses configured to support a support element thereon, and a getter support extending generally parallel to the susceptor and having an upstream edge shape that generally conforms to a corresponding downstream edge shape of the susceptor support ring, the getter support being disposed within a maximum distance from the susceptor support ring, the getter support comprising one or more recesses configured to receive corresponding one or more support elements configured to at least partially support a getter element.

In a 22nd Example, the Example of Example 21, wherein the getter support comprises the one or more support elements.

In a 23rd Example, the Example of any of Examples 21-22, further comprising a getter plate positioned in the chamber generally horizontal.

In a 24th Example, the Example of any of Examples 21-23, wherein the getter plate extends generally parallel to the susceptor and laterally substantially across the deposition chamber.

In a 25th Example, the Example of any of Examples 21-24, wherein the maximum distance is between about 1 mm and about 10 mm.

In a 26th Example, the Example of any of Examples 21-25, wherein a minimum distance from the aperture to a downstream edge of the susceptor support ring is between about 1 mm and about 150 mm.

In a 27th Example, a chemical vapor deposition system assembly comprising a susceptor support ring configured to be positioned between a gas inlet and a gas outlet of a chamber passage, and a getter support comprising a support base and one or more recesses therein, each of the one or more recesses configured to receive corresponding one or more support elements configured to support the getter plate, at least a portion of the getter support comprising a coating comprising silicon carbide (SiC) and having a thickness of between about 100 microns and about 120 microns, the getter support configured to be disposed a maximum distance of between about 1 mm and about 10 mm from the susceptor support ring.

In a 28th Example, a chemical vapor deposition system assembly comprising a susceptor support ring positioned in the chamber passage between the gas inlet and the gas outlet, the susceptor support ring comprising an aperture having a center that is disposed nearer to an upstream edge of the susceptor support ring than to a downstream edge, the susceptor support ring comprising first one or more recesses configured to support a support element thereon, wherein a minimum distance from the aperture to a downstream edge of the susceptor support ring is between about 1 mm and about 150 mm, and a getter support extending generally parallel to the susceptor and having an upstream edge shape that generally conforms to a corresponding downstream edge shape of the susceptor support ring, the getter support being disposed within a maximum distance from the susceptor support ring, the getter support comprising one or more recesses configured to receive corresponding one or more support elements configured to support a getter plate thereon.

Although this invention has been described in terms of certain embodiments, other embodiments that are apparent to those of ordinary skill in the art, including embodiments that do not provide all of the features and advantages set forth herein, are also within the scope of this invention. As will be appreciated by those with skill in the art that each of the individual variations described and illustrated herein has discrete components and features which may be readily separated from or combined with the features of any of the other several embodiments without departing from the scope or spirit of the present disclosure. All such modifications are intended to be within the scope of claims associated with this disclosure. It will also be noted that in some embodiments, the configuration of the components described herein can also provide aesthetic, ornamental, or otherwise non-functional benefits.

What is claimed is:

1. A chemical vapor deposition system comprising:
   chamber boundaries defining a deposition chamber having a deposition gas inlet at an upstream end and a gas outlet at a downstream end, the chamber boundaries defining a generally horizontal chamber passage configured to conduct gas flow along a gas flow direction therethrough, the chamber boundaries comprising quartz;
   a susceptor configured to support a substrate thereon, the chamber boundaries above the susceptor being generally transparent to radiation energy;
   a susceptor support ring positioned in the chamber passage between the gas inlet and the gas outlet;
   a getter plate positioned generally horizontally within the deposition chamber, the getter plate extending generally parallel to the susceptor and extending laterally substantially across the deposition chamber;
   a getter support comprising a support base and one or more first support posts, at least a portion of the getter support and at least one of the one or more first support posts comprising a coating comprising silicon carbide (SiC), the getter support being disposed a maximum distance of between about 1 mm and about 10 mm from the susceptor support ring; and
   a getter support shelf configured to be disposed on a generally horizontal chamber boundary and to at least partially support the getter support, wherein the getter support shelf comprises:
      one or more second support posts configured to support the getter plate and extending between the getter support and the getter support shelf, and
      one or more recesses in a face thereof, the one or more recesses configured to receive corresponding ones of the one or more second support posts.

2. The chemical vapor deposition system of claim 1, wherein the one or more recesses are disposed in a face of the getter support shelf.

3. A chemical vapor deposition system comprising:
   chamber boundaries defining a deposition chamber having a deposition gas inlet at an upstream end and a gas outlet at a downstream end, the chamber boundaries defining a generally horizontal chamber passage configured to conduct gas flow along a gas flow direction therethrough;
   a susceptor configured to support a substrate thereon, the chamber boundaries above the susceptor being generally transparent to radiation energy;
   a susceptor support ring positioned in the chamber passage between the gas inlet and the gas outlet;
   a getter plate positioned generally horizontally within the deposition chamber, the getter plate extending generally parallel to the susceptor and extending laterally substantially across the deposition chamber;
   a getter support comprising a support base and one or more support posts, at least a portion of the getter support comprising a coating comprising silicon carbide (SiC), the getter support being disposed a maximum distance from the susceptor support ring; and
   a getter support shelf configured to be disposed on a generally horizontal chamber boundary and to at least partially support the getter support, wherein the getter support shelf comprises:
      one or more second support posts configured to support the getter plate and extending between the getter support and the getter support shelf, and
      one or more recesses configured to receive corresponding ones of the one or more second support posts.

4. The chemical vapor deposition system of claim 3, wherein the chamber boundaries comprise quartz.

5. The chemical vapor deposition system of claim 3, wherein the maximum distance is between about 1 mm and about 10 mm.

6. The chemical vapor deposition system of claim 3, wherein the getter support comprises a minimum width along a direction of gas flow through the deposition chamber of about 1 mm to about 150 mm.

7. The chemical vapor deposition system of claim 3, wherein the susceptor support ring comprises at least one rounded corner.

8. The chemical vapor deposition system of claim 7, wherein the getter support comprises at least one rounded portion that generally tracks the respective at least one rounded corner and maintains the maximum distance from the susceptor support ring along a length of the at least one rounded corner.

9. The chemical vapor deposition system of claim 8, wherein the rounded portion comprises a radius of curvature of between about 50 mm and about 80 mm.

10. The chemical vapor deposition system of claim 8, wherein an edge of the rounded portion comprises a chamfer.

11. The chemical vapor deposition system of claim 10, wherein the chamfer comprises a width of between about 1 mm and about 4 mm.

12. The chemical vapor deposition system of claim 3, wherein the coating comprises a thickness of at least about 50 microns.

13. The chemical vapor deposition system of claim 3, wherein the getter support shelf is not coupled to sidewalls of the chamber boundaries.

14. The chemical vapor deposition system of claim 3, wherein the getter support is configured to include a surface that is substantially in the same plane as a surface of the susceptor support ring and a surface of the getter support shelf.

15. The chemical vapor deposition system of claim 3, wherein the getter support comprises an upstream edge shape that generally conforms to a corresponding downstream edge shape of the susceptor support ring.

16. The chemical vapor deposition system of claim 3, wherein the one or more recesses are disposed in a face of the getter support shelf.

17. A chemical vapor deposition system comprising:
chamber boundaries defining a deposition chamber having a deposition gas inlet at an upstream end and a gas outlet at a downstream end, the chamber boundaries defining a generally horizontal chamber passage configured to conduct gas flow along a gas flow direction therethrough;
a susceptor configured to support a substrate thereon, the chamber boundaries above the susceptor being generally transparent to radiation energy;
a susceptor support ring positioned in the chamber passage between the gas inlet and the gas outlet, the susceptor support ring comprising an aperture having a center that is disposed nearer to an upstream edge of the susceptor support ring than to a downstream edge, the susceptor support ring comprising first one or more recesses in one of a bottom side or top side of the susceptor support ring;
a getter plate positioned generally horizontally within the deposition chamber, the getter plate extending generally parallel to the susceptor and extending laterally substantially across the deposition chamber;
one or more first support posts configured to be inserted into the first one or more recesses and to support the susceptor support ring, the one or more first support posts extending between the getter plate and the susceptor support ring; and
a getter support extending generally parallel to the susceptor and having an upstream edge shape that generally conforms to a corresponding downstream edge shape of the susceptor support ring, the getter support being disposed within a maximum distance from the susceptor support ring, the getter support comprising second one or more recesses configured to receive corresponding one or more second support posts configured to at least partially support the getter plate.

18. The chemical vapor deposition system according to claim 17, wherein the one or more second support posts at least partially support the getter plate by extending between the getter plate and the getter support.

19. The chemical vapor deposition system according to claim 17, wherein at least a portion of the getter support comprises a coating comprising silicon carbide (SiC).

20. The chemical vapor deposition system according to claim 17, wherein the chamber boundaries comprise quartz.

* * * * *